US006841787B2

(12) United States Patent
Almogy

(10) Patent No.: US 6,841,787 B2
(45) Date of Patent: Jan. 11, 2005

(54) MASKLESS PHOTON-ELECTRON SPOT-GRID ARRAY PRINTER

(75) Inventor: Gilad Almogy, Givataim (IL)

(73) Assignee: Applied Materials, Inc., Santa Clara, CA (US)

( * ) Notice: Subject to any disclaimer, the term of this patent is extended or adjusted under 35 U.S.C. 154(b) by 76 days.

(21) Appl. No.: 10/289,209

(22) Filed: Nov. 7, 2002

(65) Prior Publication Data

US 2003/0122091 A1 Jul. 3, 2003

Related U.S. Application Data

(60) Provisional application No. 60/331,035, filed on Nov. 7, 2001.

(51) Int. Cl.[7] ................................................. G21K 5/10
(52) U.S. Cl. .................... 250/492.24; 250/542; 378/34; 378/35
(58) Field of Search ........................... 250/492.24, 542; 378/34–35

(56) References Cited

U.S. PATENT DOCUMENTS

| | | | |
|---|---|---|---|
| 3,617,125 A | 11/1971 | Sobottke | 355/46 |
| 3,861,804 A | 1/1975 | Lehmbeck | 356/108 |
| 3,877,801 A | 4/1975 | MacGovern | 353/38 |
| 3,894,332 A | 7/1975 | Nathanson et al. | |
| 3,963,354 A | 6/1976 | Feldman et al. | |
| 3,973,953 A | 8/1976 | Montgomery | 96/1 |
| 3,973,954 A | 8/1976 | Bean | 96/1 |
| 4,272,186 A | 6/1981 | Plummer | 355/34 |
| 4,353,628 A | 10/1982 | Berman | 354/5 |
| 4,377,753 A | 3/1983 | Mir | 250/578 |
| 4,455,485 A | 6/1984 | Hosaka et al. | 250/234 |
| 4,460,831 A * | 7/1984 | Oettinger et al. | 250/492.2 |
| 4,464,030 A | 8/1984 | Gale et al. | 354/4 |
| 4,465,934 A | 8/1984 | Westerberg et al. | 250/398 |

(List continued on next page.)

FOREIGN PATENT DOCUMENTS

| | | | |
|---|---|---|---|
| EP | 0299432 A2 | 1/1989 | |
| EP | 0368482 | 10/1989 | ............ G02B/3/00 |
| EP | 0485803 | 10/1991 | ........... G02B/21/00 |
| EP | 0486316 | 11/1991 | ............. G03F/7/20 |
| EP | 0558781 | 3/1992 | ............. G03F/7/20 |
| EP | 0647828 A2 | 4/1995 | |
| EP | 0707237 | 10/1995 | ............. G03F/7/20 |
| EP | 0679864 A1 | 11/1995 | |
| EP | 0759578 | 8/1996 | ............. G03F/7/20 |
| EP | 0 871 052 | 3/1998 | |
| EP | 0948027 A2 | 10/1999 | |
| EP | 1058111 A2 | 12/2000 | |

(List continued on next page.)

OTHER PUBLICATIONS

G.J. Brakenhoff, Imaging Modes in Confocal Scanning Light Microscopy (CSLM), J. Microscopy, (1979), vol. 117, Pt. 2, pp. 233–242.

(List continued on next page.)

*Primary Examiner*—John R. Lee
*Assistant Examiner*—Zia R. Hashmi
(74) *Attorney, Agent, or Firm*—McDermott Will & Emery

(57) ABSTRACT

A high resolution and high data rate spot grid array printer system is provided, wherein an image representative of patterns to be recorded on a reticle or on a layer of a semiconductor die is formed by scanning a substrate with electron beams. Embodiments include a printer comprising an optical radiation source for irradiating a photon-electron converter with a plurality of substantially parallel optical beams, the optical beams being individually modulated to correspond to an image to be recorded on the substrate. The photon-electron converter produces an intermediate image composed of an array of electron beams corresponding to the modulated optical beams. A de-magnifier is interposed between the photon-electron converter and the substrate, for reducing the size of the intermediate image. A movable stage introduces a relative movement between the substrate and the photon-electron converter, such that the substrate is scanned by the electron beams.

35 Claims, 7 Drawing Sheets

U.S. PATENT DOCUMENTS

| | | | |
|---|---|---|---|
| 4,498,742 A | 2/1985 | Uehara | 350/523 |
| 4,500,202 A | 2/1985 | Smyth | |
| 4,619,508 A | 10/1986 | Shibuya et al. | 353/122 |
| 4,668,080 A | 5/1987 | Gale et al. | 355/51 |
| 4,680,855 A | 7/1987 | Yamazaki et al. | 29/583 |
| 4,727,381 A | 2/1988 | Bille et al. | 346/108 |
| 4,950,862 A | 8/1990 | Kajikawa | 219/121.7 |
| 5,027,132 A | 6/1991 | Manns et al. | 346/108 |
| 5,085,977 A | 2/1992 | Sugawara et al. | 430/321 |
| 5,090,803 A | 2/1992 | Ames et al. | |
| 5,121,160 A | 6/1992 | Sano et al. | 355/53 |
| 5,148,322 A | 9/1992 | Aoyama et al. | 359/708 |
| 5,166,508 A | 11/1992 | Davis et al. | 250/201.9 |
| 5,196,900 A | 3/1993 | Pettersen | |
| 5,200,766 A | 4/1993 | Iwasaki | |
| 5,239,178 A | 8/1993 | Derndinger et al. | |
| 5,242,803 A | 9/1993 | Burtis et al. | 355/53 |
| 5,248,876 A | 9/1993 | Kerstens et al. | |
| 5,282,088 A | 1/1994 | Davidson | 359/664 |
| RE34,634 E | 6/1994 | Konno et al. | 362/268 |
| 5,327,223 A | 7/1994 | Korth | 356/359 |
| 5,345,336 A | 9/1994 | Aoyama et al. | 359/628 |
| 5,386,266 A | 1/1995 | Kang | 355/67 |
| 5,387,961 A | 2/1995 | Kang | 355/71 |
| 5,412,200 A | 5/1995 | Rhoads | 250/201.9 |
| 5,436,114 A | 7/1995 | Itoo et al. | 430/311 |
| 5,436,725 A | 7/1995 | Ledger | 356/357 |
| 5,452,054 A | 9/1995 | Dewa et al. | 355/67 |
| 5,463,200 A | 10/1995 | James et al. | 219/121.68 |
| 5,486,851 A | 1/1996 | Gehner et al. | 347/258 |
| 5,495,279 A | 2/1996 | Sandstrom | 347/258 |
| 5,495,280 A | 2/1996 | Gehner et al. | 347/258 |
| 5,517,279 A | 5/1996 | Hugle et al. | 355/46 |
| 5,539,568 A | 7/1996 | Lin et al. | 359/285 |
| 5,543,919 A | 8/1996 | Mumola | 356/382 |
| 5,552,820 A | 9/1996 | Genovese | 347/241 |
| 5,595,857 A | 1/1997 | Fukuda et al. | 430/311 |
| 5,631,721 A | 5/1997 | Stanton et al. | 355/71 |
| 5,635,976 A | 6/1997 | Thuren et al. | 347/253 |
| 5,659,420 A | 8/1997 | Wakai et al. | 359/368 |
| 5,659,429 A | 8/1997 | Kudo | 359/727 |
| 5,669,800 A | 9/1997 | Ida et al. | 445/25 |
| 5,691,541 A | 11/1997 | Ceglio et al. | 250/492.1 |
| 5,700,627 A | 12/1997 | Ida et al. | 430/311 |
| 5,737,084 A | 4/1998 | Ishihara | |
| 5,777,342 A | 7/1998 | Baer | 250/492.2 |
| 5,783,833 A | 7/1998 | Sugaya et al. | |
| 5,889,593 A | 3/1999 | Bareket | |
| 5,900,637 A * | 5/1999 | Smith | 250/492.22 |
| 5,932,966 A | 8/1999 | Schneider et al. | |
| 5,936,713 A | 8/1999 | Paufler et al. | 355/67 |
| 5,982,552 A | 11/1999 | Nakama et al. | 359/620 |
| 6,040,909 A | 3/2000 | Hasegawa et al. | |
| 6,043,932 A | 3/2000 | Kusunose | |
| 6,060,224 A | 5/2000 | Sweatt et al. | 430/395 |
| 6,061,185 A | 5/2000 | Yamada | 355/52 |
| 6,108,090 A | 8/2000 | Ishihara | |
| 6,130,428 A | 10/2000 | Pasch | |
| 6,133,986 A | 10/2000 | Johnson | 355/67 |
| 6,177,980 B1 | 1/2001 | Johnson | 355/67 |
| 6,188,519 B1 | 2/2001 | Johnson | 359/572 |
| 6,208,411 B1 | 3/2001 | Vaez-Iravani | |
| 6,208,413 B1 | 3/2001 | Diehl et al. | |
| 6,248,988 B1 | 6/2001 | Krantz | 250/201.3 |
| 6,259,550 B1 | 7/2001 | Gottfried-Gottfried et al. | 359/279 |
| 6,285,488 B1 | 9/2001 | Sandstrom | 359/290 |
| 6,301,000 B1 | 10/2001 | Johnson | 355/67 |
| 6,333,508 B1 | 12/2001 | Katsap et al. | 250/492.2 |
| 6,335,783 B1 | 1/2002 | Kruit | 355/52 |
| 6,373,619 B1 | 4/2002 | Sandstrom | 359/298 |
| 6,392,752 B1 | 5/2002 | Johnson | 356/511 |
| 6,399,261 B1 | 6/2002 | Sandstrom | 430/30 |
| 6,424,404 B1 | 7/2002 | Johnson | 355/44 |
| 6,476,401 B1 * | 11/2002 | Veneklasen et al. | 250/492.24 |
| 2002/0054284 A1 | 5/2002 | De Jager et al. | 355/67 |
| 2003/0042434 A1 | 3/2003 | Mankos et al. | |

FOREIGN PATENT DOCUMENTS

| | | | |
|---|---|---|---|
| EP | 1138254 A1 | 10/2001 | |
| GB | 2223861 | 8/1989 | G03H/1/04 |
| GB | 2339960 | 2/2000 | |
| JP | 57181549 | 4/1981 | G03F/5/14 |
| JP | 57191628 | 11/1982 | |
| JP | 5818622 | 2/1983 | |
| JP | 59127017 | 7/1984 | |
| JP | 0126541 | 10/1989 | |
| JP | 05224396 | 2/1992 | G03F/1/08 |
| JP | 2000066374 | 3/2000 | |
| WO | WO 97/05526 | 7/1996 | G03F/1/00 |
| WO | WO 97/34171 | 2/1997 | |
| WO | WO 97/34171 | 9/1997 | |
| WO | WO 98/12603 | 9/1997 | |
| WO | WO 98/57151 | 12/1998 | |
| WO | WO 99/48041 | 9/1999 | |
| WO | WO 00/42618 | 1/2000 | G21K/1/06 |
| WO | WO 01/09920 A1 | 2/2001 | |
| WO | WO 01/84585 A1 | 11/2001 | |
| WO | WO 02/15223 A1 | 2/2002 | |
| WO | WO 02/23172 A2 | 3/2002 | |
| WO | WO 02/23580 A1 | 3/2002 | |

OTHER PUBLICATIONS

D.J.D. Carter et al., Maskless, Parallel Patterning With Zone–Plate Array Lithography, J. Vac. Sci. Technol. B, (1999), vol. 17, No. 6, pp 3449–3452.

H. Chase et al., Improvement of Spatial Light Modulators Optical Input/Output Performance Using Microlens Arrays, Optics Letters, (1995), vol. 20, No. 12, pp. 1444–1446.

Neha Choski et al., Maskless Extreme Ultraviolet Lithography, J. Vac. Sci. Technol. B, Vol. 17, No. 6, 1999, pp. 3047–3051.

I.J. Cox et al., Scanning Optical Microscope Incorporating A Digital Framestore and Microcomputer, Applied Optics, 1983, vol. 22, No. 10, pp. 1474–1478.

Mark Davidson, A Microlens Direct–Write Concept for Lithography, SPIE, (1997), vol. 3048, pp. 346–354.

Martin Eisner, Transferring Resist Microlenses Into Silicon By Reactive Ion Etching, Opt. Eng., (1996), vol. 35, No. 10, pp. 2979–2982.

M. Feldman, Use of Zone Plate Arrays in Projection X–Ray Lithography, (1993), vol. 18, pp. 207.

Dan Gelbert, UV Thermoresists: Sub 100 nm Imaging Without Proximity Effects, SPIE, 1999, vol. 3676, pp. 786–793.

Dario Gil et al., Litographic Patterning and Confocal Imaging with Zone Plates, J. Vac. Sci. Technol. B, (2000), vol. 18, No. 6, pp. 2881–2885.

Edward J. Gratix et al., Fabrication of Microlenses by Laser Assisted Chemical Etching (LACE), (1991), SPIE, vol. 1544, pp. 238–243.

D.K. Hamilton et al., Three–Dimensional Surface Measurements Using the Confocal Scanning Microscope, (1981), Applied Physics B., pp. 211–213.

Hans Peter Herzig, Micro–optics, Elements, Systems and Applications, Institute of Microtechnology, University of Neuchatel, Switzerland.

Hessler et al., Microlens Arrays with Spatial Variation of the Optical Functions, Pure Appl. Opt., (1997) vol. 6, pp. 673–681.

J.A. Hoffnagle et al., Liquid Immersion Deep–Ultraviolet Interferometric Lithography, J. Vac. Sco. Technol. B, (1999) vol. 17, No. 6, pp. 3306–3309.

B.J. Kampherbeek et al., An Experimental Setup to Test the MAPPER Eelectron Lithography Concept, Microelectronic Eng, (2000), vol. 53, pp. 279–282.

B.J. Kampherbeek et al., Resolution of the Multiple Aperture Pixel by Pixel Enhancement of Resolution Electron Lithography Concept, J. Vac. Sci. Technol. B, (2000), vol. 18, No. 1, pp. 117–121.

P. Kruit, High Throughput Electron Lithography with the Multiple Aperture Pixel by Pixel Enhancement of Resolution Concept, J. Vac. Sci. Technol. B., (1998), vol. 16, No. 6, pp. 3177–3180.

Mark Lapedus, Startup Discloses Litho Tool for 45–nm ICs, Gets Funding From KLA–Tencor, Semiconductor Business News, Aug. 6, 2002.

Keith M. Mahoney et al., A Femtosecond Pulse–Shaping Apparatus Containing Microlens Arrays for Use with Pixellated Spatial Light Modulators, IEEE J Quantum Electronics, (1996), vol. 32, No. 12, pp. 2071–2077.

J.B. Sampsell, An Overview of the Performance Envelope of Digital Micromirror Device (DMD) Based Projection Display Systems, Society for Information Display 1994 International Symposium (San Jose, Jun. 12–17, 1994), pp. 1–4.

R. Seltmann et al., New System for Fast Submicron Optical Direct Writing, Microelectronic Engineering (1996), vol. 30, pp. 123–127.

Henry I. Smith, A Proposal for Maskless, Zone–Plate–Array Nonolithography, J. Vac. Sci. Technol. B, (1996), vol. 14, No. 6, pp. 4318–4322.

Hiroshi Suganuma et al., Deep UV Litography Using Continuous–Wave 266 nm Radiation From All Solid–State Frequency Guadrupled Nd:YAG Laser, SPIE, vol. 2440, pp. 126–135.

M. Switkes et al., Immersion Lithography at 157 nm, J. Vac. Sci. Technol. B, (2001) vol. 19, No. 6, pp. 2353–2356.

H.J. Tiziani et al., Theoretical Analysis of Confocal Microscopy with Microlenses, Applied Optics,(1996), vol. 35, No. 1, pp. 120–125.

H.J. Tiziani et al., Three–Dimensional Analysis by a Microlens–Array Confocal Arrangement, Applied Optics (1994), vol. 33, No. 4, pp. 567–572.

H.J. Tiziani et al., Confocal Principle for Macro– and Microscopic Surface and Defect Analysis, Opt. Eng., (2000), vol. 39, No. 1, pp. 32–39.

H.J. Tiziani et al., Chromatic Confocal Microscopy with Microlenses, J. Mod. Opt. (1996), vol. 43, No. 1, pp. 155–163.

H.J. Tiziani et al., Microlens Arrays for Confocal Microscopy, Opt. & Laser Technol., (1997), vol. 29, No. 2, pp. 85–91.

R. Volkel et al., Microlens Array Imaging System For Photolithography, Opt. Eng. (1996), vol. 35, No. 11, pp. 3323–3330.

R. Volkel et al., Microlens Lithography: A New Fabrication Method for Very Large Displays, Proceedings of Fifteenth International Display Research Conference, Hamamatsu, Japan, Oct. 16–18, 1995, pp. 713–716.

R. Volkel et al., Microlens Lithography: A New Fabrication Method for Very Large Displays, Proceedings from the 1995 International Conference on Micro– and Nanofabrication, Sep. 25–29, 1995.

R. Volkel et al., Microlens Lithography, (1996), Conference: 1996 Display Manufacturing Technology Conference, Digest of Technical Papers, pp. 95–96.

R. Volkel et al., Microlens Lithography: A new approach for large display fabrication, Microelectronic Eng., (1996), vol. 30, pp. 107–110.

R. Volkel et al., Microlens Lithography and Smart Mask, (1997), Microelectronic Engineering, vol. 35, pp. 513–516.

M.J. Wieland, Field Emission Photocathode Array for Multibeam Electron Lithography, Microelectronic Eng. (2001), 57–58, pp. 155–161.

The Half Moon Bay Maskless Lithography Workshop, Sponsored by DARPA and the SRC, The Half Moon Bay Lodge, The Fireside Room, Nov. 9–10, 2000.

Lithography Review, Important Developments, in Microlithography, Semi Newsletter Service, (2002), vol. 4, No. 9, pp. 1–6.

"High throughput electron lithography with the multiple aperture pixel by pixel enhancement of resolution concept", Kruit, P., J. Vac. Sci. Technol. B 16(6), Nov./Dec. 1998.

"A proposal for maskless, zone–plate–array nanolithography", Smith, Henry I., J. Vac. Sci. Techno. B 14(6), Nov./Dec. 1996.

"Microlens arrays with spatial variation of the optical functions", Hessler, Th.. et al., Pure Appl. Opt. 6(1997) 673–681.

"A Microlens Direct–Write Concept for Lithography", Davidson, M., SPIE 3048, p. 346–355.

"Lithographic patterning and confocal imaging with zone plates", Gil, D. et al., J. Vac. Sci. Technol. B 18(6), Nov./Dec. 2000, pp. 2881–2885.

"Maskless, parallel patterning with zone–plate array lithography", Carter et al., J. Vac. Sci. Technol. B 17(6), Nov./Dec. 1999, pp. 3449–3552.

"Immersion lithography at 157 nm", Switkes, M. et al., J. Vac. Sci. Technol. B, vol. 19, No. 6, Nov./Dec. 2001, pp. 2353–2356.

"Liquid immersion deep–ultraviolet interferometric lithography", Hoffnagle, J. et al., Vac. Sci. Technol. B 17(6), Nov./Dec. 1999, pp. 3306–3309.

"An Overview of the Performance Envelope of Digital Micromirror Device (DMD) Based Projection Display Systems", Sampsell, J. B., Society for Information Display 1994 International Symposium (San Jose, Jun. 12–17, 1994), pp. 1–4.

"UV Thermoresists: Sub 100nm Imaging Without Proximity Effects", Gelbart, D. et al., SPIE vol. 3676, pp. 786–793.

"Quality control and process observation for the micro assembly process",Tilo Pfeifer et al, Measurement, Institute of Measurement and Control; vol. 30, No. 1, Jul. 2001, pp. 1–18.

International Search Report dated Aug. 4, 2003.

M. Feldman, "Projection X–Ray Lithography Using Arrays of Zone Plates," British Library, May 21, 2001. pp. 136–144.

Ihsan J. Djomehri, T.A. Savas, and Henry I. Smith, "Zone–Plate–Array Lithography in The Deep Ultraviolet," J. Vac. Sci. Technol. B, 16(6), Nov./Dec. 1998, pp. 3426–3429.

D.J.D. Carter, Dario Gil, R. Menon, Ihsan J. Djomehri, and Henry I. Smith, "Zone–Plate Array Lithography (ZPAL): A New Maskless Approach," Part of the SPIE Conference on Emerging Lithographic Technologies III, Mar. 1999, pp. 324–332.

M. Feldman, "Use of Zone Plate Arrays in Projection X–Ray Lithography," OSA Proceeding On X–Ray Projection Lithography, May 21, 2001, vol. 18, pp. 207–209.

Henry I. Smith, "A Proposal For Maskless, Zone–Plate–Array Nanolithography," J. Vac. Sci. Technol. B 14(6), Nov./Dec. 1996, pp. 4318–4322.

D.J.D. Carter, Dario Gil, Rajesh Menon, Mark K. Mondol, and Henry I. Smith, "Maskless, Parallel Patterning With Zone–Plate Array Lithography," J. Vac. Sci. Technol. B 17(6), Nov./Dec. 1999, pp. 3449–3452.

Hans J. Tiziani, Michael Wegner, Daniela Steudle, "Confocal Principle For Macro– And Microscopic Surface And Defect Analysis," Opt. Eng. 39(1), Jan. 2000, pp. 32–39.

Dario Gil, Rajesh Manon, D.J.D. Carter, and Henry I. Smith, "Lithographic Patterning And Confocal Imaging With Zone Plates," J. Vac. Sci. Technol. B. 18(6), Nov./Dec. 2000, pp. 2881–2885.

H.J. Tiziani, R. Achi, R.N. Kramer, and L. Wiegers, "Theoretical Analysis Of Confocal Microscopy With Microlenses," Applied Optics, vol. 35, No. 1, Jan. 1, 1996. pp. 120–125.

* cited by examiner

MASKLESS PHOTON-ELECTRON SPOT-GRID ARRAY PRINTER

CLAIM OF PRIORITY FROM PROVISIONAL APPLICATION

This application claims priority from U.S. the provisional application Ser. No. 60/331,035.

FIELD OF THE INVENTION

The present invention relates to a maskless photon-electron spot-grid array lithography system. The present invention has particular applicability to lithography for imaging semiconductor substrates.

BACKGROUND ART

Photolithography is a technique for producing images on semiconductor devices. Typically, an image formed on a mask or "reticle" is transferred to a semiconductor substrate, or wafer, where it exposes a resist layered on the substrate. It is desired to pattern smaller and smaller features on semiconductor substrates, which requires the use of shorter and shorter wavelengths of the light that is used to image the patterns. Optical lithography systems using light in the deep ultraviolet (UV) wavelengths create patterns with resolutions of about 0.25 microns. Further decreases in wavelength to 193 nm enable the imaging of patterns with resolutions of 0.18 microns and 0.13 microns. For further improvements in resolution even;shorter wavelengths are necessary, and a number of systems using the shorter wavelengths of electron beams have been proposed to image patterns with resolutions of 0.1 microns and below.

Electron beam mask projection, such as in SCALPEL, (L. R. Harriott, S. D. Berger, J. A. Liddle, G. P. Watson, and M. M. Mkrtchyan, J. Vac. Sci. Technology, B12, 3533 (1994)) use a scattering mask illuminated by electrons to pattern a substrate. While such systems are capable of high resolution, they are limited by the requirement of making multiple specialty masks, the requirement of including multiple electron lenses, and the ultimate limitation of stochastic Coulomb interactions between individual particles in the beam.

A hybrid photon-electron array printer based on a traditional deep-ultraviolet demagnification scanner-steppers and using a 4× mask is described in High throughput electron lithography with multiple aperture pixel by pixel enhancement of resolution concept, Journal of Vacuum Science and Technology B 16(6), November/December 1998, page 3177. In this proposal a 4× mask is illuminated by 106–108 optical subbeams formed by a microlens array. After demagnification these subbeams are focused on a photon-electron converter plate. Each photon subbeam triggers the emission of a narrow beam of electrons. The electron beams are focused individually on a wafer. The mask and wafer are both scanned through the many beams, exposing the entire wafer. The use of the optical imaging system simplifies the image formation and the use of the final electron patterning provides improved resolution. Further, this concept overcomes the inherent problem of Coulomb interaction present in the SCALPEL system.

Unfortunately, due to decreasing design rules and the wide use of RET (Resolution Enhancement Techniques) such as OPC (Optical Proximity Correction) and PSM (Phase Shift Masks), the masks used in image-projection systems have become increasingly difficult and expensive to make. Masks fro electron-projection systems are also extremely difficult and expensive to make. Since many masks are needed to form the multiple patterns required to manufacture an integrated circuit, the time delay in making the masks and the expense of the masks themselves is a significant cost in the manufacture of semiconductors. This is especially so in the case of smaller volume devices, where the cost of the masks cannot be amortized over a large number of devices. Thus, it is desirable to provide a fast apparatus for making semiconductor chips while eliminating the need for expensive masks. It is also desirable to improve the obtainable resolution of optical lithography. Further, such a device may be useful for directly patterning a small number of substrates, such as runs of prototype devices, and for making masks.

Accordingly, it is desirable to develop a hybrid photon-electron system having the high resolution of an electron imaging system, the simplicity and speed of optical systems, and the high throughput of a mask or massively parallel writing system, but do so without the requirement of a mask.

SUMMARY OF THE INVENTION

The present invention provides a maskless photon-electron spot-grid array lithography system. According to the present invention, patterns are produced by a massive array of optical beams modulated by a spatial light modulator (SLM) array. The optical beams are focused on a photon-electron converter, which forms corresponding arrays of electron beams. The electron beams are focused on the substrate to expose a desired pattern on a substrate layered with electron-sensitive resist.

According to the present invention, the foregoing and other advantages are achieved in part by a method for printing, comprising the steps of generating an array of substantially parallel light beams; modulating individual light beams to form a spot-grid pattern corresponding to a sampling of an image to be recorded on a substrate; converting the modulated light beams to electron beams to provide a corresponding spot-grid pattern of electron beams; and scanning the substrate relative to the electron beams while the generating, modulating, converting and scanning steps are being performed, such that the image is recorded on the substrate.

Another advantage of the present invention is a step of compensating for mechanical inaccuracies in the movable stage.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The present invention provides a printer that includes a maskless direct-write hybrid optical/electron imaging system. A programmable optical system forms a massive array of optical beams which are individually focused on a photon-electron converter. The spot-grid pattern formed by the focused optical beams is converted to a corresponding spot-grid pattern of electron beams which are focused on a semiconductor substrate layered with an electron-sensitive resist so as to expose the resist with the spot-grid array pattern. The substrate is then translated relative to the electron beam array by a movable stage as subsequent patterns are focused on the substrate so as to build up a final complete image on the substrate.

In certain embodiments of the present invention, the optical radiation source of the inventive printer includes a light source for generating an array of substantially parallel light beams, and a programmable spatial light modulator selectively modulates optical beams from the array of optical beams. An array of microlenses is provided for focusing light from the light source into the photon-electron converter. Relay optics, such as an optical demagnifier, may be employed between the spatial light modulator and the microlens array to decrease the size of the optical image so as to map the individual pixels from the spatial light modulator onto corresponding elements in the microlens array. The microlenses can be a two-dimensional array of diffractive or refractive micro-lenses. The photon-electron converter produces a spot-grid array electron image corresponding to the optical image incident on it, but with significantly reduced spot sizes. This electron image is then focused on the substrate with an appropriate electron lens.

A movable stage moves the substrate relative to the electron beam array in a substantially linear scanning direction that is slanted slightly relative to one axis of the electron beam array such the surface of the substrate is completely exposed as the substrate is scanned across the slanted array of electron beams. In various embodiments of the present invention, the movable stage and the array configuration provide for alternative scan patterns including patterns which overlap, patterns which do not overlap, patterns which provide redundancy, and patterns that provide for various degrees of interleaving. As the substrate is scanned relative to the electron beam array, the pattern generated by the optical and electron systems are programmed so as to build up the desired final and complete image on the substrate.

Figure 1:
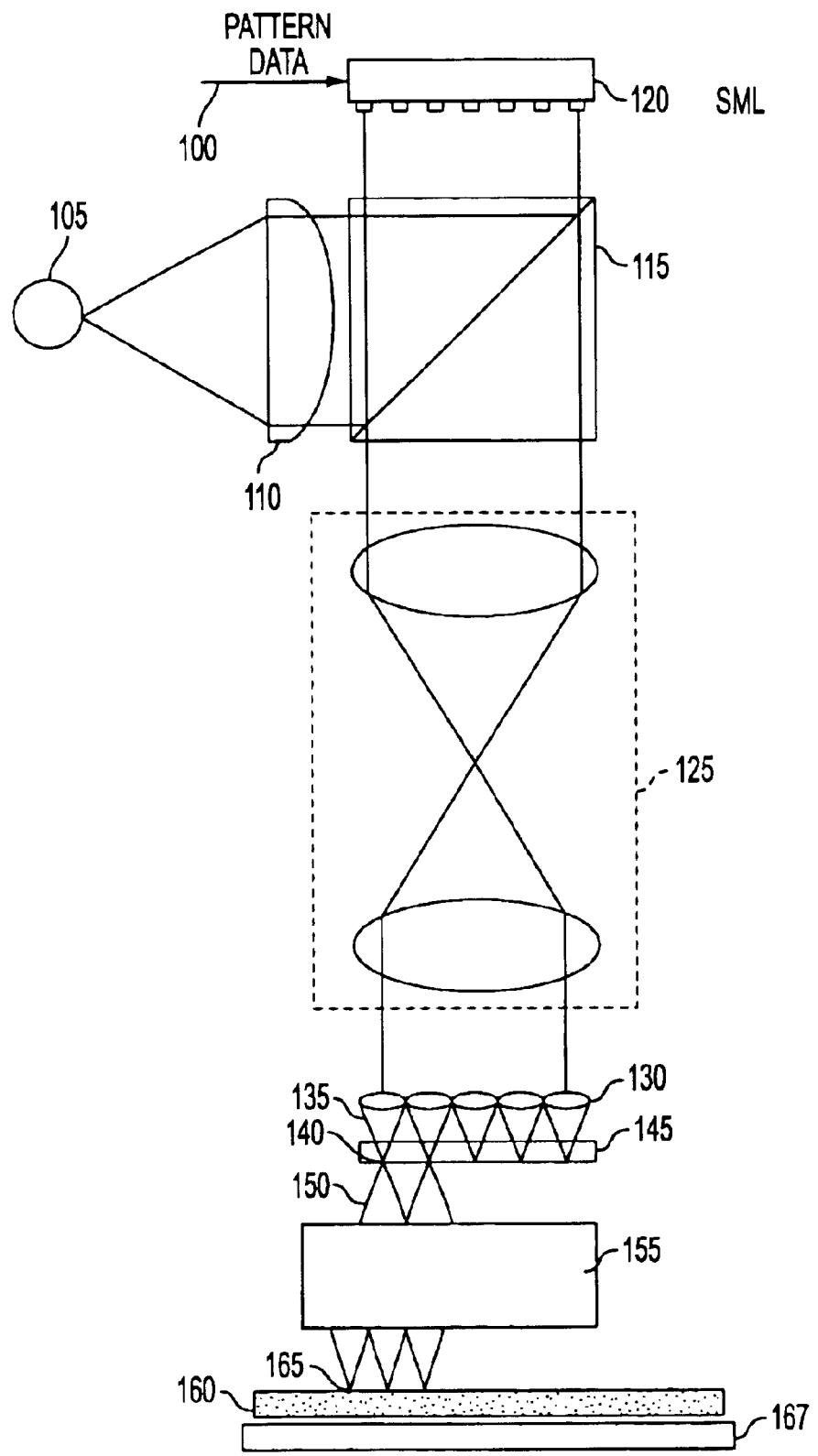
FIG. 1 illustrates a printer according to an embodiment of the present invention.

FIG. 1 illustrates a printer according to an embodiment of the present invention. Referring to FIG. 1, a light source 105, which may be a continuous wave laser or a pulsed laser, provides optical radiation which is collimated by collimating lens 110 and reflected by beam splitter 115 onto a two-dimensional spatial light modulator (SLM) 120.

Spatial light modulator 120 modulates the light so as to produce a parallel array of modulated light beams corresponding to a desired pattern. In one embodiment of the present invention, SLM 120 comprises an array of micromirrors, such as the Model DMD available from Texas Instruments of Dallas, Tex. The individual micromirrors of SLM 120 are responsive to an input pattern data signal 100 such that light is selectively reflected from each SLM element (also called a pixel) to produce the desired pattern of parallel light beams. The parallel light beams pass back through beam splitter 115 to relay optics 125.

Relay optics 125 image each of the SLM elements onto a corresponding microlens in microlens array (MLA) 130. Relay optics 125 preferably provide for a reduction in the overall size of the optical pattern to correspond to the preferred smaller size of microlens array 130 relative to SLM 120. However, in general the function of relay optics 125 is to map the optical spot-grid pattern produced by SLM 120 (referred to as the "first intermediate pattern") onto microlens array 135. Accordingly, as will be described in more detail below, the relay optics may provide a magnification of 1x or greater as required by the relative sizes of SLM 120 and microlens array 135.

Microlens array 130 comprises an array of microlenses, with one microlens corresponding to each element of SLM 120. Each microlens focuses the optical beam incident on it to an optical spot 140 on the surface of photon-electron converter 145. Thus the optical spot-grid pattern formed on the surface of photon-electron converted 145 (referred to as the "second intermediate pattern) corresponds to the first intermediate pattern except that its overall size may be magnified (or demagnified) by relay optics 125 and the size of the individual beams have been reduced to smaller spots by the focusing effect of microlens array 130.

Spots 140 focused on photon-electron converter 145 are well separated from one-another to prevent cross-talk or interference between the beams. In the preferred embodiment, photon-electron converter 145 comprises a photocathode which generates an array of electron sources 150 in response to incident light beams. The spot-grid pattern of electron sources produced by photon-electron converter 145 (referred to as the third intermediate pattern) thus corresponds to the second intermediate pattern focused on the surface of photon-electron converter 145.

Electron optics 155 focuses electrons emerging from the individual electron sources of photon-electron converter 145 to points on substrate 160. As a result a spot-grid pattern is imaged on substrate 160 (referred to as the fourth intermediate pattern). Different alternatives of electron optics 155 are provided in the embodiments described below, which provide various degrees of demagnification in between the image size of the third intermediate pattern and the fourth intermediate pattern. (See FIGS. 1A–1D and the corresponding discussion.) However, in all cases the spots of the fourth intermediate pattern are significantly reduced in size relative to the spots of the first intermediate pattern generated by SLM 120. In the preferred embodiment, the size of spots 165 imaged by electrons onto substrate 160 have typical dimensions of 25 nanometers. This significant reduction is spot size results in the improved resolution of the present invention.

Figure 1A:
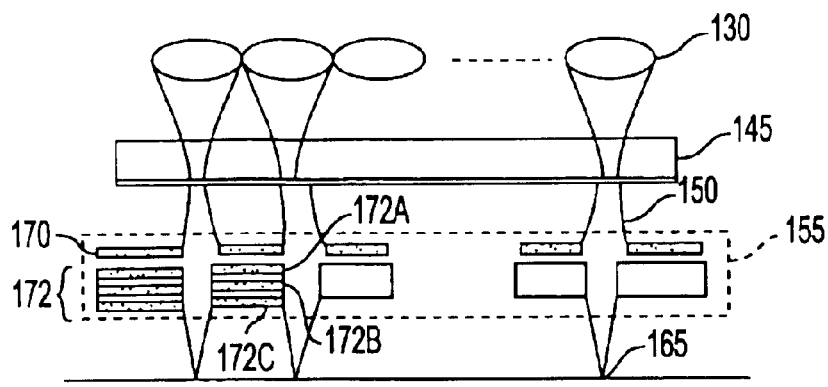
FIG. 1A illustrates one embodiment of electron optics 155 of FIG. 1.

An alternative embodiment of electron optics 155 is illustrated in FIG. 1A. In the alternative embodiment illustrated in FIG. 1A, electron optics 155 comprises an array of apertures 170 and an array of Einzel lenses 172. Einzel lenses are well known as electrostatic lens for focusing electron beams. As illustrated in FIG. 1A, Einzel lenses consist of three parallel plates, wherein the top and bottom plates (172A and 172C) have the same potential. An electron beam passes through holes in each of the three plates, and is focused to a spot on substrate 160. In this embodiment the spacing between adjacent spots on substrate 160 is equal to the corresponding spacing between the optical spots incident on photon-electron converter 145, but the size of the individual spots is significantly reduced, resulting in a significant improvement in resolution.

Figure 1B:
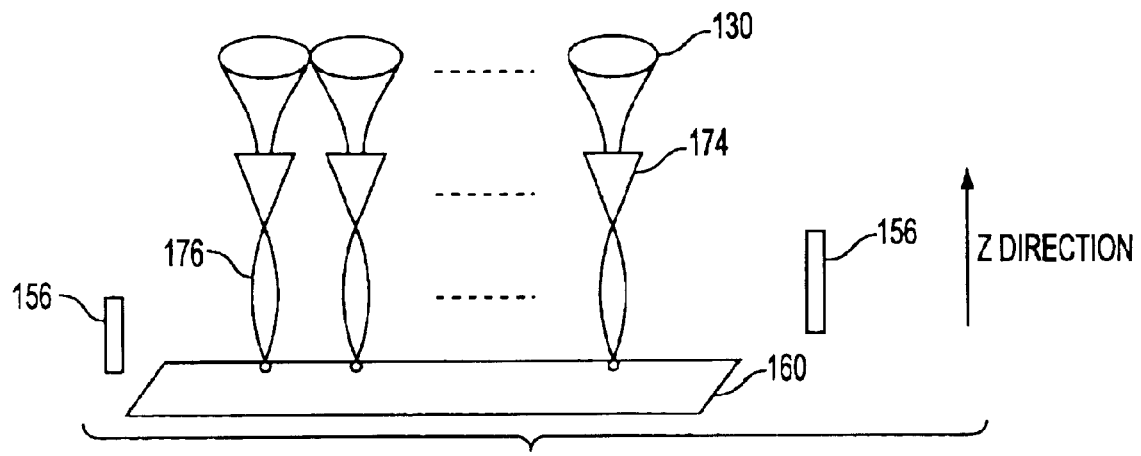
FIG. 1B illustrates an alternative embodiment of photon-electron converter 145.

An alternative embodiment of photon-electron converter 145 is illustrated in FIG. 1B. In this alternative embodiment, wherein the second intermediate pattern generated by microlens array 130 are focused onto a corresponding array of microtips 174. Optically activated microtips, such as those used as electron sources in electron microscopes, are physically small, sharply pointed sources of electrons. Each microtip generates electrons in response to incident optical illumination, and the electron source size is determined by the physical size of the microtip. The "tip of the tip" of these sources is microscopically small, and the physical size of the electron emitting tip of a microtip is significantly smaller than the size of the optical spot incident on the microtip. Thus the spot size of the third intermediate pattern is significantly smaller than that of the second intermediate pattern. Therefore, in this embodiment, the microtip provides for a significant reduction in spot size and a corresponding improvement in resolution. Electrons from the array of microtip sources 174 are focused into an array of electron beams 176 by electron optics 156, which forms the fourth intermediate pattern on substrate 160. Electron optics 156 must focus the electrons emerging from the individual microtips and accelerate them towards substrate 160. Such electron optics are well known, and may comprise, for example, a uniform magnetic field combined with an electrostatic field, both aligned along the z-axis (normal to the surface of the substrate.)

Figure 1C:
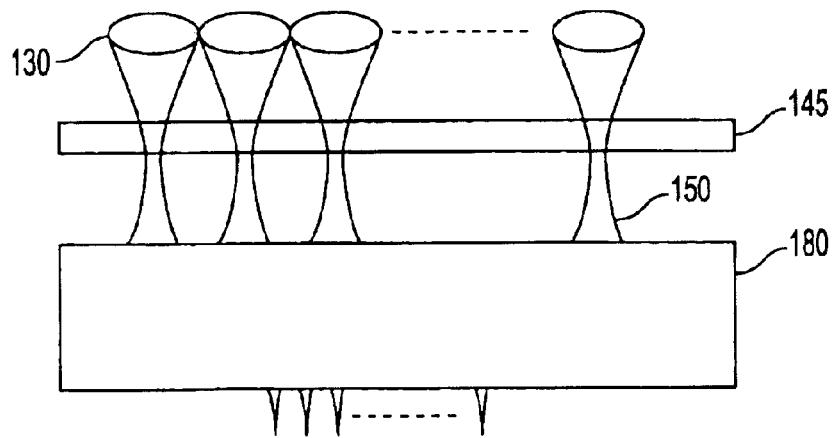
FIG. 1C illustrates another embodiment of electron optics 155.

Another embodiment of the electron optics 155 is shown in FIG. 1C. In this embodiment, electron optics 155 comprises a demagnifying lens 180, such as is known in the field of electron microscopy. In this embodiment, the demagnification reduces the overall size of the fourth intermediate pattern, the distance between adjacent spots, and the size of individual spots. The reduction of the individual spot size improves resolution. However, this embodiment requires a design of a wide field optics objective, which may suffer from distortions.

Figure 1D:
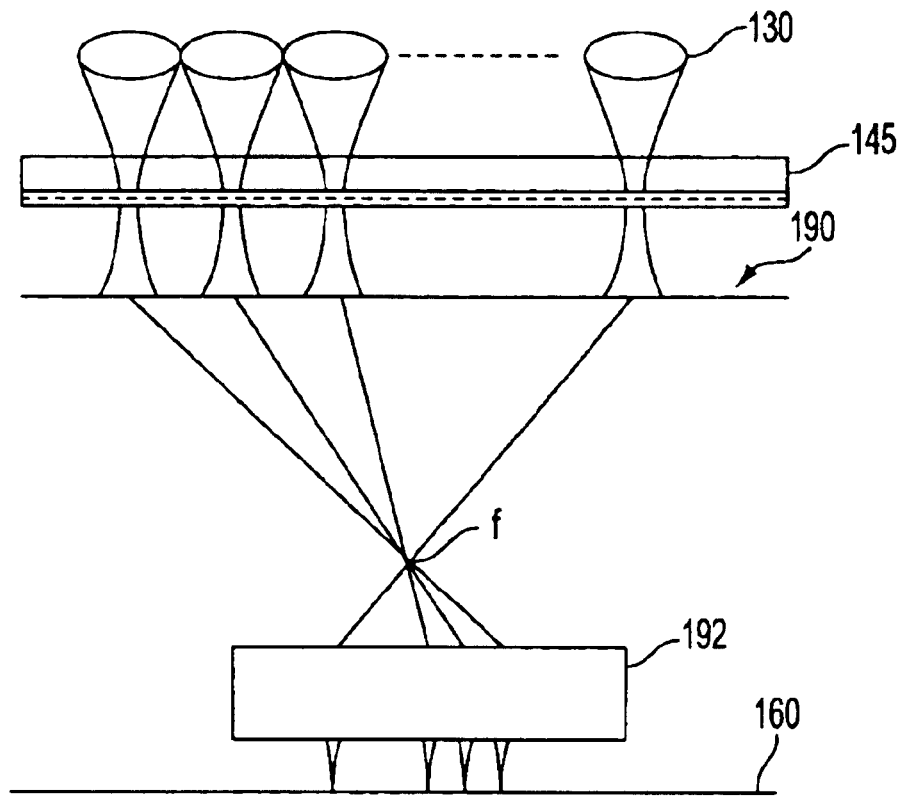
FIG. 1D illustrates another embodiment of electron optics 155.
Figure 1E:
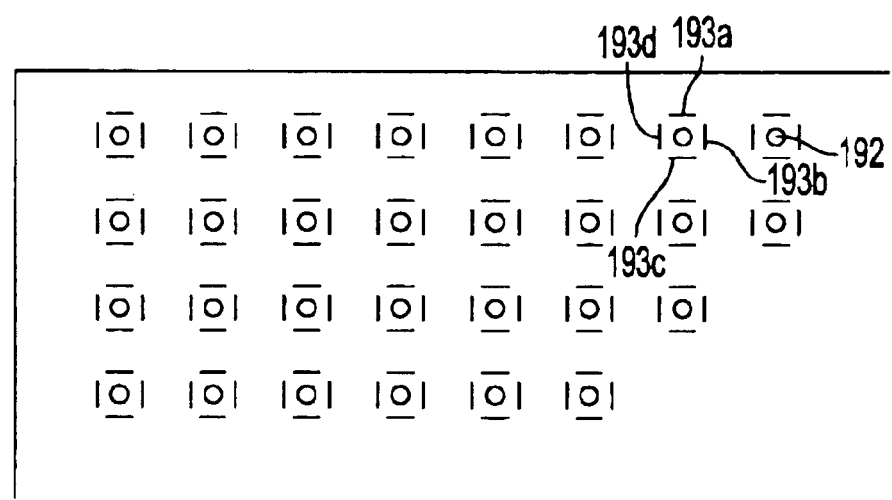
FIG. 1E illustrates the electron deflector array of FIG. 1D.

Another embodiment of the electron optics 155 is shown in FIG. 1D. The embodiment of FIG. 1D uses an electron deflector array 190 in combination with a micro-electron lens array 192. Electron deflector array 190 is further illustrated in FIG. 1E and comprises an array of quadrapole deflectors for deflecting each of the electron beams to a point "f." As illustrated, electron deflector array 190 comprises an array of apertures for passing individual electron beams, and four electrostatic plates 193a, 193b, 193c, and 193d placed about each aperture. A voltage signal is applied to each plate for deflecting the electron beams through point f. Each Micro electron lens array is 192 similar in construction to the array of Einzel lenses 172 illustrated in FIG. 1A is positioned to re-collimate the electron beams forming a demagnified image. That is, the fourth intermediate pattern is smaller in overall size and has smaller individual spot sizes relative to the third intermediate image. Thus, the use of a deflector array results in the reduction of both spot size and distance between spots (overall image size) without the need to design a wide-field objective, as in FIG. 1C.

Mechanical stage 167, which supports substrate 160, is illustrated in FIG. 1. Mechanical stage 167 translates substrate 160 in the y direction, which is substantially parallel to one of the axes y' of the electron beam array of the fourth intermediate pattern. The deviation from parallel is chosen such that as substrate 160 is translated relative to the beam array, and as the beam array is modulated to form sequential spot-grid patterns, the spot-grid patterns interlace or interleave so as to leave no gaps in the mechanical cross-scan direction (the x direction). In this way a complete image is scanned onto substrate 160. There are a number of ways in which this slanted scan can be implemented. For example, the beams may track paths with centers spaced on pixel width apart; or they may track paths spaced one-half pixel width apart and spots on adjoining tracks could be offset one-half pixel width (or less) along the y-axis, resulting in a more tightly packed array of spots on the substrate. Further, scanning patterns with a pitch of less than one pixel between scan lines can be interleaved.

Another embodiment of the present invention will now be described with reference to FIG. 2. The printer of FIG. 2 comprises the above-described components of the printer of FIG. 1, including light source 105 and collimating lens 110. In this embodiment, SLM 220 is a selectively transmissive spatial light modulator, which modulates a parallel array of beams similar to those of SLM 120 in response to a pattern data signal 100. That is, light incident on each element, or pixel, is selectively transmitted or blocked, corresponding to an on or off state for that pixel. An array of microshutters suitable for this function is described in "A proposal for maskless, zone-plate-array nanolithography," Smith, Henry I., J. Vac. Sci Techno. B 14(6), November/December 1996 and in "Maskless Lithography Using a Multiplexed Array of Fresnel Zone Plates," U.S. Pat. No. 5,900,637, issued to Henry I. Smith, May 4, 1999.

Figure 2:
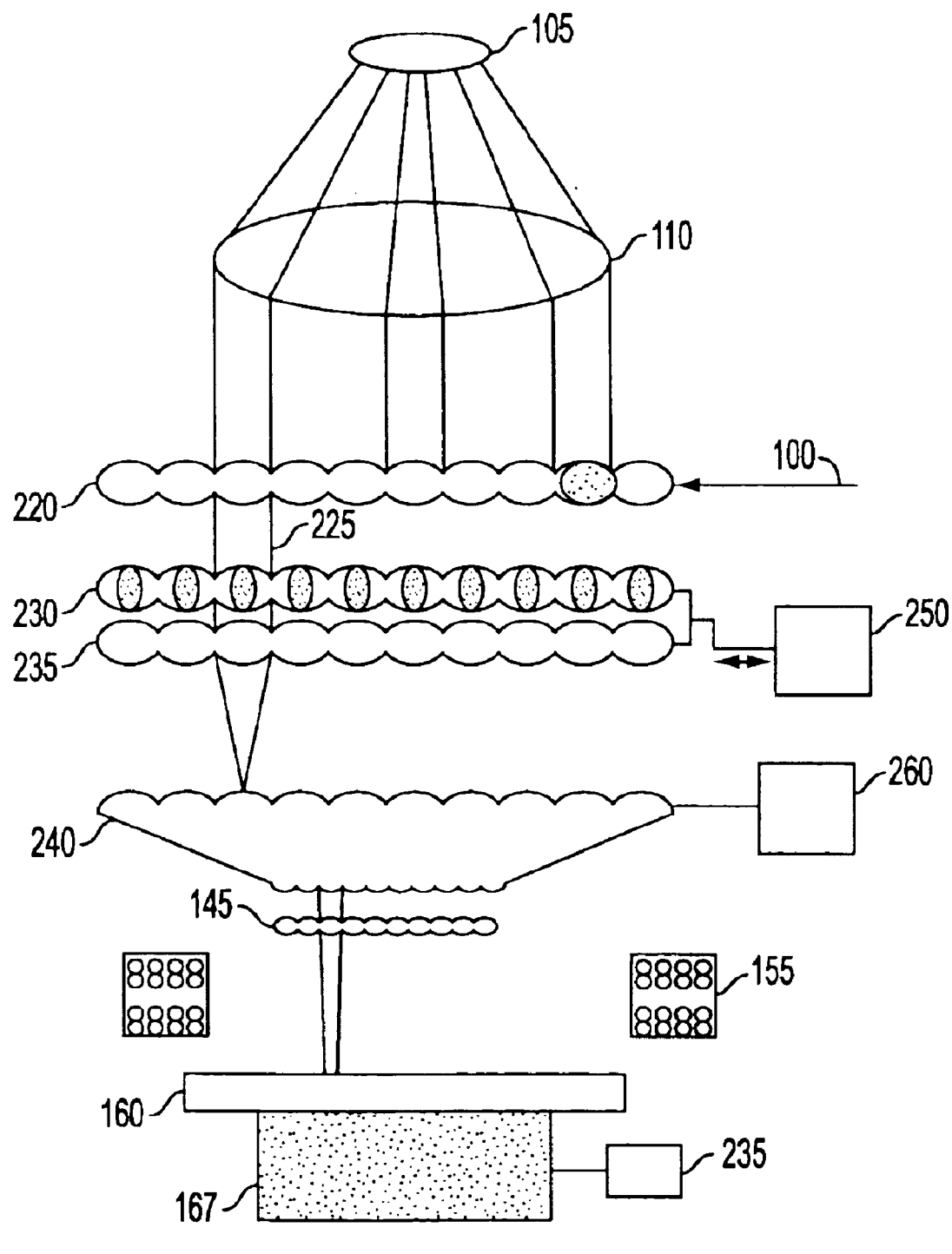
FIG. 2 is a cross section of a printer according to another embodiment of the present invention.

Referring still to FIG. 2, light beams 225 from SLM 220 are shaped by beam shaper 230, which narrows the beams prior to their transmission to focusing optics 235. Focusing optics 235 comprises a microlens for focusing each of the beams onto an optical demagnifier 240. Focusing optics 235 focus modulated light beams 225 into an image substantially equal in size to the original image produced by SLM 220, however the individual spot sizes are greatly reduced.

Optical demagnifier 240 reduces the overall image size of the pattern produced by SLM 220 and further reduces the individual spot sizes. Optical demagnifier 240 focuses the demagnified image onto the surface of photon-electron converter 145.

The configuration of FIG. 2 allows the use of relatively low cost focusing optics 235, such as microlenses with a relatively small numerical aperture (NA). Several types of lenses can be used in focusing optics 235, such as standard lenses or microlenses of either the refractive or diffractive type. For relatively low NAs and large fields of view (FOVs), plastic diffractive elements can be used. This allows for FOVs of many tens of centimeters across or even more. For high NA applications microlens arrays (typically tens of microns across) can be used. If diffractive lens elements are used, the lens array can further contain an aperture array (i.e., a pinhole array) to truncate the higher scattering orders created by the diffractive elements. Diffractive lenses are particularly suitable when used in conjunction with short wavelengths of light, such as extreme ultraviolet (EUV) of about 13 nm, to practice the invention.

Examples of microlens arrays are abundant in the literature, and include "Microlens array with spatial variations of the optical functions," Hessler et al, Pure Appl. Opt. 6(1997) 673–681, and "A Microlens Direct-Write Concept for Lithography," Davidson, SPIE 3048, p346.

Moreover, the micro-lens arrays referred to herein, such as microlens array 130 and focusing optics 235, can be a single array of lenses, or multiple arrays arranged in series, as per conventional optical techniques, so the optical paths of the individual lens elements from the separate arrays form a compound lens. Such an arrangement results in arrays of compound lenses having a higher numerical aperture than can be obtained with arrays of single lenses. Such compound micro-lens arrays can be mechanically assembled by stacking individual lens arrays, or manufactured by, for example, well-known MEMS (micro-electro mechanical systems) manufacturing techniques.

Examples of arrays of diffractive optical elements are Fresnel zone plates. They can be designed to work at any wavelength, and arrays of Fresnel zone plates have been used in lithography in a process referred to as zone-plate-array lithography (ZPAL). These arrays and there use are described in "Lithographic patterning and confocal imaging with zone plates," Gil et al, J. Vac. Sci. Technol. B 18(6), November/December 2000, and "Maskless, parallel patterning with zone-plate array lithography, Carter et al, J. Vac. Sci. Technol. B 17(6), November/December 1999. In general, these diffractive zone plate arrays are suitable substitutes for refractive optical microlens arrays.

Figure 4:
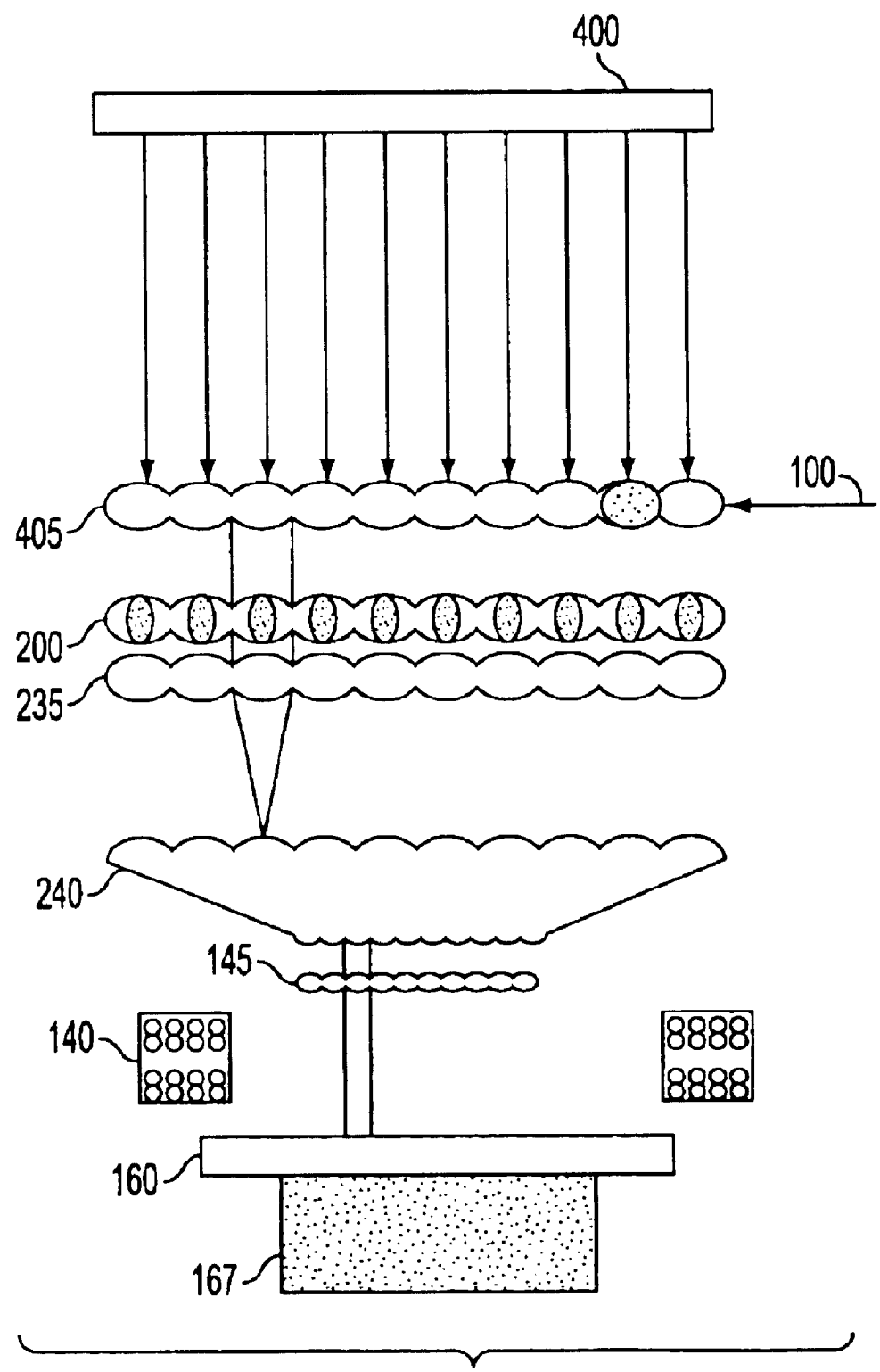
FIG. 4 is a cross section of a printer according to another embodiment of the present invention.

In an alternative embodiment of the present invention, illustrated in FIG. 4, an array of individually controlled lasers are used as light source 400 to create array of beams incident on SLM 405. In this embodiment of the present invention, the individual lasers can be modulated to a desired intensity (i.e., gray level) to more finely control the image writing. Light source 400 can comprise an array of vertical cavity surface emitting lasers (VCSELs), available from Band Gap Engineering of Colorado. VCSELs are semiconductor lasers that emit light from the top of the chip, straight up.

Figure 3:
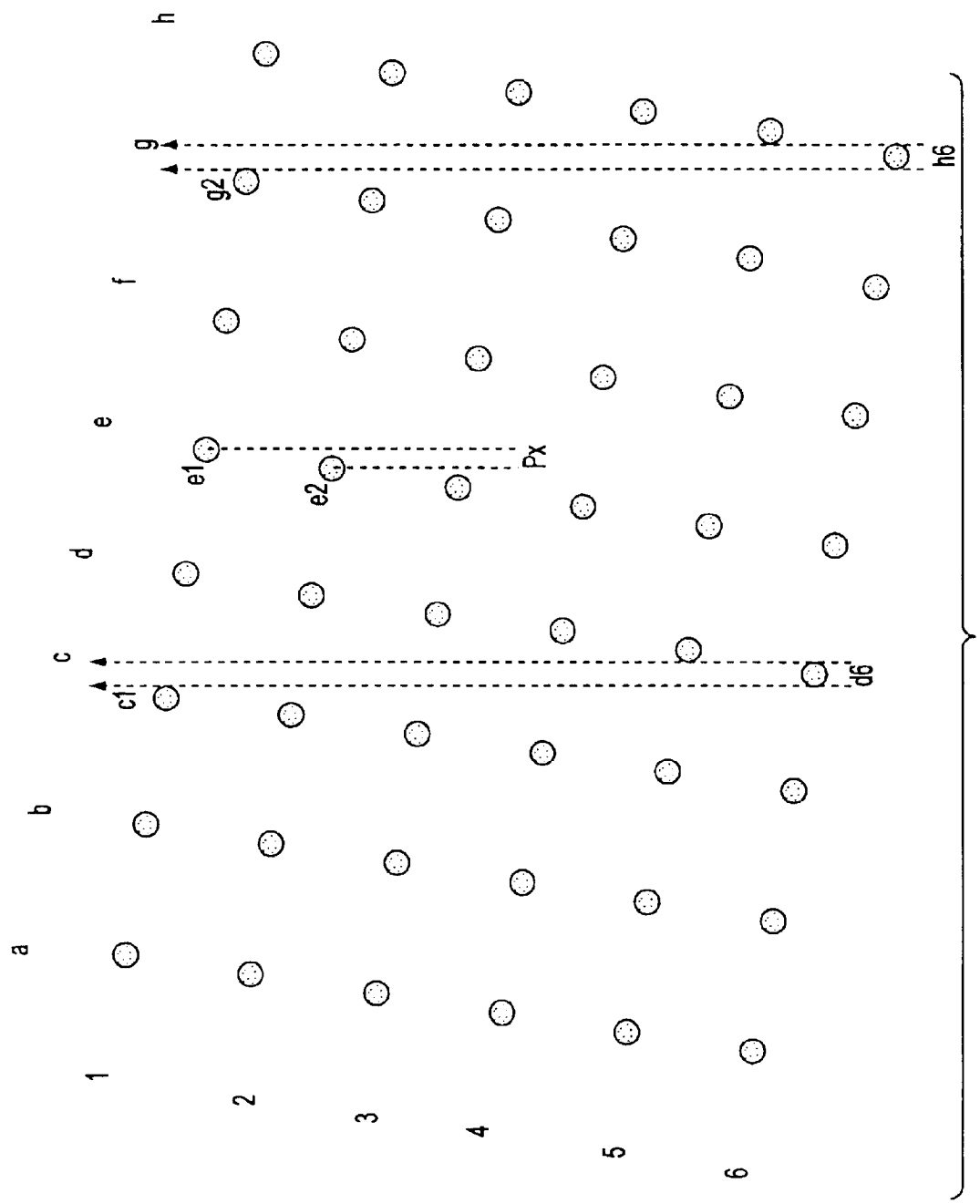
FIG. 3 illustrates an example of a slanted scan pattern.

An example of a scanning pattern is illustrated in FIG. 3. As illustrated, an array of spots (the fourth intermediate pattern) is incident on substrate 160. For simplicity, FIG. 3 shows an eight wide (a–h) by six deep (1–6) array of spots. When practicing the present invention, the spot array will typically consist of hundreds, thousands or more electron beams. The shift in the mechanical cross-scan x direction between the centers of spots in consecutive lines determines the pixel size in the x direction (i.e., the projection px on the x-axis of the distance between the e'th spot in the first line e1 and the e'th spot in the 2nd line e2). To obtain continuous coverage of substrate 160, the last spot in column d6 must trace a path no more than one pixel away in the cross-scan x direction from the tangent of the first spot in an adjacent column (c1). The pixel size in the mechanical scan y direction py (not shown) is determined by the distance traversed between the spot center of a given spot between two consecutive irradiations of substrate 160; that is, the distance between the center of a spot f4 at time 0 ("f4t0") and the same spot one irradiation interval later ("f4t1"). This distance is determined by multiplying the stage velocity and irradiation interval.

In a further embodiment of the present invention, substrate 160 is translated relative to the beam array to form an interlacing pattern, as each spot is moved a distance that is greater than the pitch between two successive spots, during successive irradiations of substrate 160, when a pulsed laser source (such as an Excimer laser or Q laser) for light source 105.

Motion of substrate 160 can be achieved by any means ensuring accurate and linear motion, such as can be obtained from a conventional interferometer-controlled stage with linear motors and air-bearings, commercially available from Anorad Corporation of New York. Further, in an alternative embodiment of the invention, the substrate can be held stationary and the optics generating the beam array can be translated relative to the substrate is translated relative to the wafer.

To correct for any residual inaccuracy such as that created by mechanical vibrations of the stage, a compensator for compensating for inaccuracies in the stage's movement. Referring to FIG. 2, an two-dimension interferometer device 235, which is either part of the stage or an additional component, is coupled to stage to detect its position and to allow for the generation of a position error signal. These errors can be compensated by a number of alternatives. First, a compensator 250 can be coupled to beam shaper 230 and focusing optics 235 to move them by an amount sufficient to compensate for the error in the stage position. Second, a compensator 260 can be coupled to demagnifier 240 to move it by an amount to compensate for the stage position error. Third, a compensator could be coupled to a mirror movable on two axes for varying the angle of incidence of the light source onto one of the optical elements of the printer, so as to compensate for the stage position error. For example, if the optical path was folded by 90 degrees between beam shaper 230 and focusing optics 235, and a movable mirror was positioned to direct light from beam shaper 230 to focusing optics 235, changing the angle of the mirror would vary the angle of incidence of the light on focusing optics 235, resulting in a translation of the focused image.

Figure 5A:
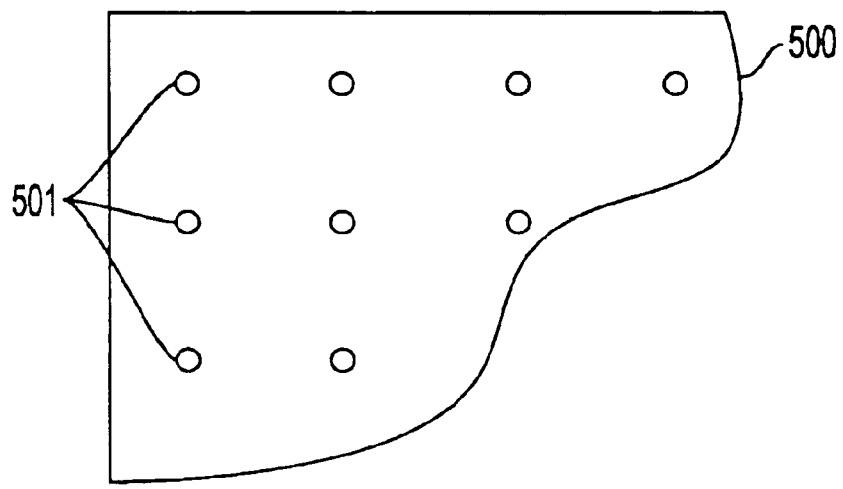
FIG. 5A illustrates a pinhole array limiter.
Figure 5B:
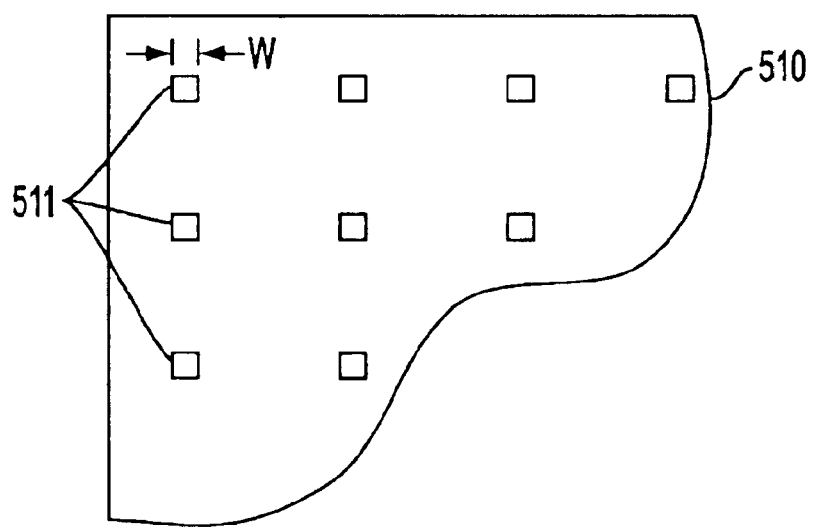
FIG. 5B illustrates an array of apertures.

In further embodiments of the present invention, the inventive printer comprises a limiter preceding photon-electron converter 145. The limiter prevents or significantly reduces writing errors to photon-electron converter 145 resulting from an interaction with reflected optical beams, non parallel optical beams, side-lobes and the like. Referring to FIG. 5a, a limiter 500 comprises a pinhole array, wherein pin holes 501 correspond to the light beams of the light beam array generated to impinge on photon-electron converter 145. In another embodiment of the present invention illustrated in FIG. 5b, limiter 510 comprises an array of apertures 511 corresponding to the light beams of the light beam array, each aperture 511 having a width w at least half a wavelength of each of the light beams.

One advantage of the present invention is that it eliminates the requirement of a high-order reduction lens. More specifically, mask-based lithography systems typically utilize masks that are four or five times (4× or 5×) the size of the desired final pattern. This requires the use of a demagnification lens, commonly referred to as a "stepper lens," which are typically quite expensive. This has been the case even in current mask-based hybrid photon-electron systems such as described in "High throughput electron lithography with multiple aperture pixel by pixel enhancement of resolution concept," Kruit, P., J. Vac. Sci. Technol. B 16(6), November/December 1998. In contrast, when a programmable maskless source is used, as in the various embodiments of the present invention, the magnification between the source patterns and the substrate is not subject to the same restrictions, and may be one for both the optical and electron optics. Low-distortion optics are more easily designed with low magnifications. Accordingly, the optics may be designed for low distortion, and the input data signal patterns may be loaded accordingly. That is, since the resolution in the present system is determined by the spot size, not the image demagnification, the pattern data to be mapped to the substrate needs simply to be loaded into the programmable source array at the appropriate time and in the appropriate position in accordance with the configuration selected for the photon optics, electron optics, and writing strategy.

The writing strategy and other design considerations affect the design choice for the magnification. For example, if a simple linear scan of a slightly rotated scan is used, where the grid comprises N×N Pixels with a pitch of D, and the address unit size on the wafer is d, then the required de-magnificaiton M will be M=D/(d*N). In some cases this might lead to a slight magnification. For example, if D=15 microns, N=1000 and d=25 nm, then M=0.6. (A slight demagnification. However, the cost and distortion corresponding to this slight demagnification would be significantly less than that of current 4× and 5× stepper lens.

This results in simpler and more distortion-free optics. In fact, the best optics would result from the use of an SLM image having the same size as the final image. i.e., a 1× magnification. Such a reduction element is required in mask systems, where the mask is significantly larger than the desired final image and such reduction elements, or "stepper lenses" are typically quite expensive. However, in the preferred embodiment of the present invention, this element may be advantageously The following calculations illustrate the throughput of a printer according to an embodiment of the invention.

Definitions:

FOV—Field-of-view in microns on substrate (assume square)

D—Pitch between spots on substrate in microns p—Pixel size on substrate in microns ny and nx—number of rows and columns in array respectively N—total number of spots in array DR—Data-rate requirement (pixels/second/array)

FR—Frame-rate requirement (array-read/second)

V—stage velocity in y direction in microns/sec

Since FOV=D*nx and, without interleaving, ny=D/p, the total number of spots N is:

$$N=nx*ny=(FOV/D)*(D/p)=FOV/p$$

For a given data-rate requirement (DR) the frame rate (FR) and hence stage velocity required are:

$$FR=DR/N=DR*p/FOV$$

and $$V=FR*p=DR*p2/FOV$$

Example:

FOV=10 mm=10000 micron

DR=10 Tera-pix/sec=1012 pix/sec

P=10 nm=0.01 micron

N=10000/0.01=1,000,000=106=>an 100 by 100 array;

FR=1010/104=106=1 mega-frames/second

V=106*0.01 micron=10 mm/sec

The present invention is applicable to the manufacture of various types of semiconductor devices, particularly high-density semiconductor devices having a design rule of about 0.18□ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein. Further, the description is intended to be descriptive and not limiting. For example, the description of the present invention refers to light sources and discusses optical sources and optical radiation in terms of light and light images. However, the inventor includes all wavelengths of electromagnetic radiation when he references "light," and not to limit it to visible wavelengths. For example, shorter wavelengths of light, referred to as ultraviolet, deep ultraviolet, extreme ultra-violet, X-rays etc all are considered within the scope of "light" as they all refer to photons and electromagnetic radiation, and are distinguished only by the wavelength of the radiation.

What is claimed is:

1. Maskless lithography apparatus for exposing a substrate with an image formed by an array of electron beams, the system comprising:

a programmable optical radiation source for providing an array of optical beams modulated in response to an input data signal and forming a sequence of optical patterns;

a photon-electron converter, for converting the optical beams to electron beams and forming a sequence of electron beam patterns;

electron optics for focusing the electron beams onto the substrate; and a translator for introducing relative movement between the substrate and the electron beams such that the substrate is exposed with a sequence of electron beam patterns forming the image.

2. The apparatus of claim 1, wherein the electron optics demagnifies the electron beam pattern.

3. The apparatus of claim 1, further comprising an optical microlens array interposed between the programmable optical radiation source and the photon-electron converter.

4. The apparatus of claim 1, wherein the programmable optical radiation source comprises an array of individually modulated lasers.

5. The apparatus of claim 1, wherein the optical radiation source comprises:

a light source; and a programmable spatial light modulator for providing an array of optical beams individually modulated in response to the input data signal.

6. The apparatus of claim 4, further comprising an optical microlens array interposed between the programmable optical radiation source and the photon-electron converter, positioned such that there is a one-to-one correspondence between the optical beams and the elements of the microlens array.

7. The apparatus of claim 5, further comprising an optical microlens array interposed between the programmable optical radiation source and the photon-electron converter, positioned such that there is a one-to-one correspondence between the optical beams and the elements of the microlens array.

8. The apparatus of claim 3, wherein the microlenses are diffractive.

9. The apparatus of claim 1, wherein the translator is for moving the substrate along an axis slanted relative to one axis of the electron beam pattern.

10. The apparatus of claim 9, wherein the movable stage is for moving the substrate such that as the substrate is moved a distance substantially equal to a length of the electron beam array in the scanning direction, the electron beams trace a substantially continuous path on the substrate surface in a mechanical cross-scan direction.

11. The apparatus of claim 3, wherein the array of optical beams is two-dimensional.

12. The apparatus of claim 9, further comprising a compensator for compensating for inaccuracies in the movable stage movement.

13. The apparatus of claim 12 wherein the compensator comprises a servo for moving the electron beam array to compensate for mechanical inaccuracies in the movement of the stage.

14. The apparatus of claim 12, further comprising a compensator selected from the group consisting of a movable mirror, an electro-optic element and an acousto-optic element for varying an angle of incidence of the light source onto the lens array for compensating for the mechanical inacurracies in the movable stage.

15. The apparatus of claim 10, wherein the movable stage is for moving the substrate such that the electron beams overlap as they trace the continuous path on the substrate surface.

16. The apparatus of claim 1, further comprising a limiter interposed between the optical radiation source and the photon-electron converter for reducing writing errors onto the photon-electron converter.

17. The apparatus of claim 16, wherein the limiter comprises a pinhole array having pinholes corresponding to the array of optical beams from the optical radiation source.

18. The apparatus of claim 16, wherein the limiter comprises an array of apertures corresponding to the array of optical beams from the optical radiation source, each aperture having a width of at least half a wavelength of each of the optical beams.

19. A method for exposing a substrate with an image, the method comprising the steps of:
generating an array of optical beams;
modulating the array of light beams individually in response to an input data signal;
converting the optical beams to electron beams to provide an intermediate electron beam array;
focusing the electron beams onto the substrate to expose a the substrate to a pattern of electron beams; and
moving the substrate relative to the electron beams while the generating, modulating, converting and focusing steps are being performed to expose the substrate with an image comprising a sequence of electron beam patterns.

20. The method of claim 19, further comprising compensating for mechanical inaccuracies in the step of moving.

21. Maskless lithography apparatus comprising:
a light source;
a spatial light modulator positioned to receive light from the light source for providing an array of individually modulated optical beams in response to an input data signal;
an array of lenses for focusing each of the optical beams;
a photon-electron converter positioned at the focus of the optical beams for converting each optical beam to an electron beam;
optics interposed between the spatial light modulator and the array of lenses for mapping the beams onto lenses in a one-to-one correspondence;
an electron lens interposed between the photon-electron converter and the substrate for focusing the individual electron beams on the substrate; and
a stage for providing relative movement between the substrate and the photon-electron converter such that the image is recorded on the substrate with the array of electron beams.

22. The apparatus as in claim 21 wherein the movable stage translates the substrate in a direction slightly slanted relative to one axis of the array of electron beams.

23. Maskless lithography apparatus comprising:
a light source;
a spatial light modulator positioned to receive light from the light source for providing an array of individually modulated optical beams in response to an input signal;
an array of lenses for focusing each of the modulated optical beams;
a photon-electron converter positioned at the focus of the modulated optical beams for converting each modulated optical beam to an electron beam;
an electron demagnifier interposed between the photon-electron converter and the substrate; and
a movable stage for supporting the substrate and for introducing a relative movement between the substrate and the photon-electron converter such that the image is recorded on the substrate with the array of electron beams.

24. The apparatus as in claim 23 wherein the movable stage translates the substrate in a direction slightly slanted relative to one axis of the array of electron beams.

25. The apparatus as in claim 24 wherein the spatial light modulator is a micromirror array.

26. Maskless lithography apparatus for exposing a substrate with an image formed by an array of electron beams, the system comprising:
a programmable optical radiation source for providing an array of optical beams modulated in response to an input data signal and forming a sequence of optical patterns;
a photon-electron converter, comprising an array of optically sensitive microtips, for converting the optical beams to electron spots and forming a sequence of electron spot patterns;
electron optics for focusing electrons emitted from the electron spots onto the substrate; and
a translator for introducing relative movement between the substrate and the focused electron spots such that the substrate is exposed with a sequence of focused electron spot patterns forming the image.

27. The apparatus of claim 26, further comprising an optical microlens array interposed between the programmable optical radiation source and the photon-electron converter.

28. The apparatus of claim 26, wherein the programmable optical radiation source comprises an array of individually modulated lasers.

29. The apparatus of claim 26, wherein the optical radiation source comprises:
- a light source; and
- a programmable spatial light modulator for providing an array of optical beams individually modulated in response to the input data signal.

30. The apparatus of claim 28, further comprising an optical microlens array interposed between the programmable optical radiation source and the photon-electron converter, positioned such that there is a one-to-one correspondence between the optical beams and the elements of the microlens array.

31. The apparatus of claim 29, further comprising an optical microlens array interposed between the programmable optical radiation source and the photon-electron converter, positioned such that there is a one-to-one correspondence between the optical beams and the elements of the microlens array.

32. The apparatus of claim 27, wherein the microlenses are diffractive.

33. The apparatus of claim 26, wherein the translator translated the substrate along an axis slanted relative to one axis of the electron beam pattern.

34. The apparatus of claim 27, wherein the array of optical beams is two-dimensional.

35. The apparatus of claim 3 further comprising an optical demagnifier interposed between the optical microlens array and the photon-electron converter.

* * * * *